US012785823B2

(12) United States Patent
Hsu et al.

(10) Patent No.: US 12,785,823 B2
(45) Date of Patent: Nov. 3, 2026

(54) IMPEDANCE TRANSFORMATION CIRCUIT AND RADIO FREQUENCY POWER RELIABILITY TEST SYSTEM

(71) Applicant: REALTEK SEMICONDUCTOR CORP., Hsinchu (TW)

(72) Inventors: Chia-Hsiang Hsu, Hsinchu (TW); Chih-Chieh Wang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 344 days.

(21) Appl. No.: 18/382,560

(22) Filed: Oct. 23, 2023

(65) Prior Publication Data

US 2024/0223289 A1 Jul. 4, 2024

(30) Foreign Application Priority Data

Dec. 28, 2022 (TW) ................................. 111150264

(51) Int. Cl.
*H04B 17/309* (2015.01)
*H03H 7/00* (2006.01)

(52) U.S. Cl.
CPC ............ *H04B 17/309* (2015.01); *H03H 7/00* (2013.01)

(58) Field of Classification Search
CPC .... G01R 35/00; G01R 31/2822; G01R 27/32; H04B 17/309; H03H 7/00
See application file for complete search history.

(56) References Cited

U.S. PATENT DOCUMENTS

| | | | | |
|---|---|---|---|---|
| 6,674,293 | B1 * | 1/2004 | Tsironis | H01P 5/04 324/637 |
| 10,536,128 | B1 * | 1/2020 | Podell | H01P 3/06 |
| 10,942,212 | B2 * | 3/2021 | Shapiro | G01R 31/3277 |
| 10,971,871 | B2 * | 4/2021 | Molnar | H01R 24/64 |
| 2019/0311885 | A1 * | 10/2019 | Yuzurihara | H01J 37/32155 |

FOREIGN PATENT DOCUMENTS

WO WO 0161780 A1 8/2021

* cited by examiner

*Primary Examiner* — Curtis A Kuntz
(74) *Attorney, Agent, or Firm* — Li & Cai Intellectual Property (USA) Office

(57) ABSTRACT

An impedance transformation circuit and a radio frequency power reliability test system are provided. The impedance transformation circuit can be used in a radio frequency power measurement system. The radio frequency power measurement system includes a signal generator, a buffer, a device under test, an attenuator, and a spectrum analyzer. The impedance transformation circuit includes a plurality of impedance transformers, which correspond to a plurality of impedance points on a reflection coefficient circle of a Smith chart, respectively. In a radio frequency power reliability test, the impedance transformers are alternatively coupled between the device under test and the attenuator in turn, and the spectrum analyzer is configured to measure an output power corresponding to each of the impedance points, such that two of the impedance points respectively corresponding to a maximum output power and a minimum output power are found by the radio frequency power measurement system.

16 Claims, 6 Drawing Sheets

IMPEDANCE TRANSFORMATION CIRCUIT AND RADIO FREQUENCY POWER RELIABILITY TEST SYSTEM

CROSS-REFERENCE TO RELATED PATENT APPLICATION

This application claims the benefit of priority to Taiwan Patent Application No. 111150264, filed on Dec. 28, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an impedance transformation circuit and a radio frequency power reliability test system, and more particularly to an impedance transformation circuit capable of replacing a load tuner in a radio frequency power reliability test and being used in a radio frequency power measurement system, and a radio frequency power reliability test system including the impedance transformation circuit.

BACKGROUND OF THE DISCLOSURE

In a radio frequency (RF) power reliability test, a load tuner is generally utilized by an RF power measurement system to adjust a load impedance to a reflection coefficient circle of a Smith chart, and to find two impedance points with the maximum and minimum output power on the reflection coefficient circle. However, the high expense of load tuners significantly raises the cost of performing an RF power reliability test.

SUMMARY OF THE DISCLOSURE

In response to the above-referenced technical inadequacies, the present disclosure provides an impedance transformation circuit capable of replacing a load tuner in a radio frequency (RF) power reliability test and being used in an RF power measurement system 10, and an RF power reliability test system including the impedance transformation circuit.

In order to solve the above-mentioned problems, one of the technical aspects adopted by the present disclosure is to provide an impedance transformation circuit for use in a radio frequency power measurement system. The RF power measurement system includes a signal generator, a buffer, a device under test (DUT), an attenuator, and a spectrum analyzer. The impedance transformation circuit includes a plurality of impedance transformers, which correspond to a plurality of impedance points on a reflection coefficient circle of a Smith chart, respectively. In a radio frequency power reliability test, the impedance transformers are coupled between the device under test and the attenuator in turn, and the spectrum analyzer is configured to measure an output power corresponding to each of the impedance points, such that two of the impedance points respectively corresponding to a maximum output power and a minimum output power are found by the radio frequency power measurement system.

In order to solve the above-mentioned problems, one of the technical aspects adopted by the present disclosure is to provide an RF power reliability test system, which includes a radio frequency power measurement system and an impedance transformation circuit. The RF power measurement system includes a spectrum analyzer, a signal generator, a buffer, a DUT and an attenuator. The signal generator is used to generate an input signal. The buffer is coupled to the signal generator. The device under test is coupled to the buffer and outputs a radio frequency signal in response to receiving the input signal. The attenuator is coupled to the spectrum analyzer, and the attenuator is configured to attenuate the radio frequency signal input to the spectrum analyzer. The impedance transformation circuit includes a plurality of impedance transformers, which correspond to a plurality of impedance points on a reflection coefficient circle of a Smith chart, respectively. In a radio frequency power reliability test, impedance transformers are coupled between the device under test and the attenuator in turn, and the spectrum analyzer is configured to measure an output power corresponding to each of the impedance points, such that two of the impedance points respectively corresponding to a maximum output power and a minimum output power are found by the radio frequency power measurement system.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
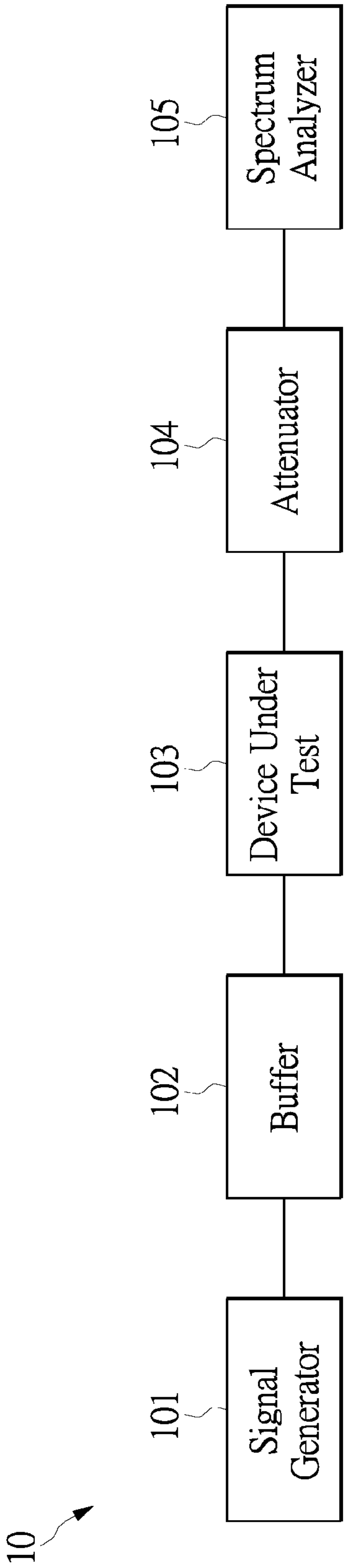
FIG. 1 (Prior Art)
FIG. 1 is a schematic diagram of a radio frequency power measurement system according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a schematic diagram of a radio frequency (RF) power measurement system according to one embodiment of the present disclosure. As shown in FIG. 1, an RF power measurement system 10 includes a signal generator 101, a buffer 102, a device under test 103, an attenuator 104 and a spectrum analyzer 105.

The signal generator 101 is configured to generate an input signal, the buffer 102 is coupled to the signal generator 101, and the input signal is input to the device under test 103 through the buffer 102. The device under test 103 can include, for example, an RF circuit coupled to the buffer 102 and output an RF signal in response to receiving the input signal. The attenuator 104 is coupled to the spectrum analyzer 105 and is configured to attenuate the RF signal input to the spectrum analyzer 105, and the spectrum analyzer 105 is configured to measure the output power.

As mentioned above, the radio frequency power measurement system 10 can adjust a load impedance to a reflection coefficient circle of the Smith chart through a load tuner (not shown in FIG. 1) during the radio frequency power reliability test, and can find two impedance points with the maximum and minimum output power on the reflection coefficient circle. However, the cost of performing an RF power reliability test may be increased due to the expensiveness of load tuners.

Figure 2:
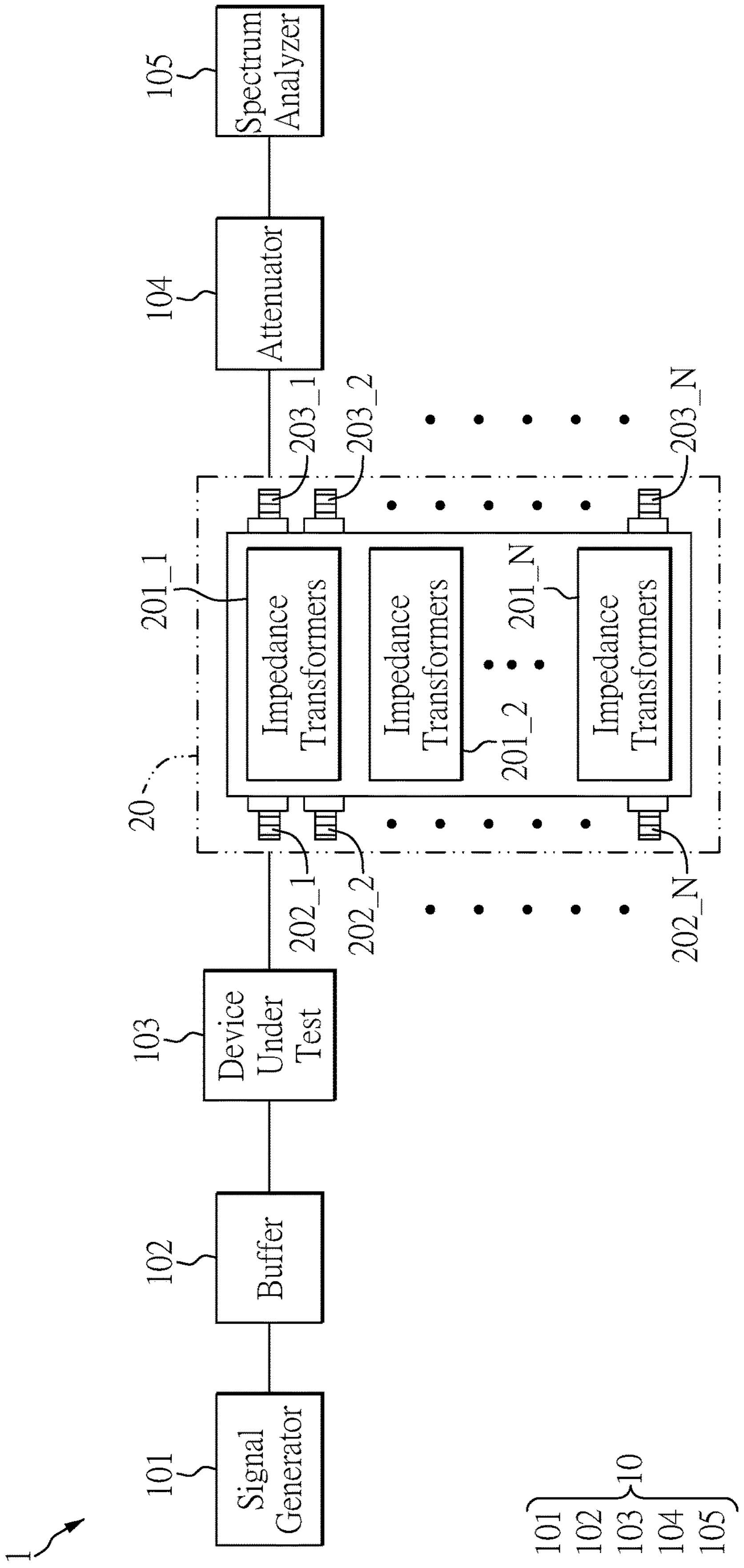
FIG. 2 is a schematic diagram of an impedance transformation circuit and a radio frequency power reliability test system according to one embodiment of the present disclosure.

In order to solve the above-mentioned problems, the present disclosure provides an impedance transformation circuit capable of replacing a load tuner in an RF power reliability test and being used in an RF power measurement system 10, and an RF power reliability test system including the impedance transformation circuit. Reference is made to FIG. 2, which is a schematic diagram of an impedance transformation circuit and an RF power reliability test system according to one embodiment of the present disclosure.

As shown in FIG. 2, the RF power reliability testing system 1 includes a signal generator 101, a buffer 102, a device under test 103, an attenuator 104, a spectrum analyzer 105 and an impedance conversion circuit 20. The impedance transformation circuit 20 includes a plurality of impedance transformers 201_1 to 201_N (i.e., N is an integer greater than 1) corresponding to a plurality of impedance points on a reflection coefficient circle of the Smith chart, respectively.

Furthermore, in a radio frequency power reliability test, the impedance transformers 201_1 to 201_N are coupled between the device under test 103 and the attenuator 104 in turn, and the spectrum analyzer 105 can be configured to measure an output power corresponding to each of the impedance points, such that two of the impedance points respectively corresponding to a maximum output power and a minimum output power are found by the RF power measurement system 10.

In practice, the impedance transformation circuit 20 can further include a plurality of first SMA connectors 202_1 to 202_N corresponding to the impedance transformers 201_1 to 201_N, respectively, and a plurality of second SMA connectors 203_1 corresponding to the impedance transformers 203_1 to 203_N, respectively. Each of the impedance transformers is coupled between the device under test 103 and the attenuator 104 through the corresponding first SMA connector and the corresponding second SMA connector.

For example, the impedance transformer 201_1 is coupled between the device under test 103 and the attenuator 104 through the first SMA connector 202_1 and the second SMA connector 203_1, the impedance transformer 201_2 is coupled between the device under test 103 and the attenuator 104 through the first SMA connector 202_2 and the second SMA connector 203_2, and so forth, the impedance transformer 201_N is coupled between the device under test 103 and the attenuator 104 through the first SMA connector 202_N and the second SMA connector 203_N.

Figure 3:
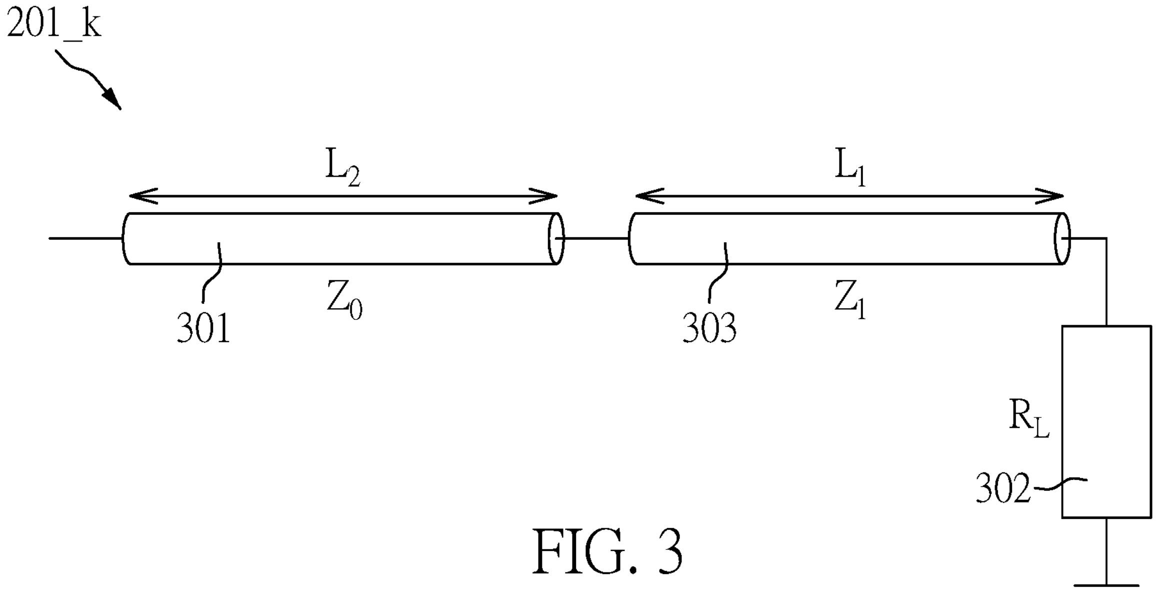
FIG. 3 is a schematic diagram of each impedance transformer in FIG. 2.

Specifically, each of the impedance transformers is a quarter-wavelength impedance transformer. Reference can be made to FIG. 3, which is a schematic diagram of each impedance transformer in FIG. 2. As shown in FIG. 3, the k-th impedance transformer 201_*k* (where k is any integer from 1 to N) includes a feeding line 301 with a first characteristic impedance Z0, a resistor 302 with a load resistance RL, and a transmission line 303 between the feeding line 301 and the resistor 302 has a second characteristic impedance Z1.

Furthermore, the load resistance RL and the first characteristic impedance Z0 can both be fixed values, and for the convenience of the following description, the load resistance RL and the first characteristic impedance Z0 of the present embodiment both being 50 ohms is taken as an example, but the present disclosure is not limited thereto. In addition, the transmission line 303 has a first line length $L_1$, and the feeding line 301 has a second line length $L_2$.

On the other hand, it should be understood that the Smith chart can be used to represent a correspondence between the load impedance and the reflection coefficient (i.e., Γ). In other words, any impedance point on the Smith chart can be used to represent the load impedance and the corresponding reflection coefficient, and the aforementioned reflection coefficient circle is a circle on the Smith chart determined by taking an absolute value of the reflection coefficient (i.e., $|\Gamma|$) as a radius.

Therefore, when the impedance transformation circuit 20 is used in the RF power measurement system 10, the RF power measurement system 10 can first define the absolute value of the reflection coefficient according to verification requirements of the RF power reliability test (such as, but not limited to, $|\Gamma|=0.5$), and a reflection coefficient circle whose radius is the absolute value of the reflection coefficient is determined on the Smith chart.

Figure 4:
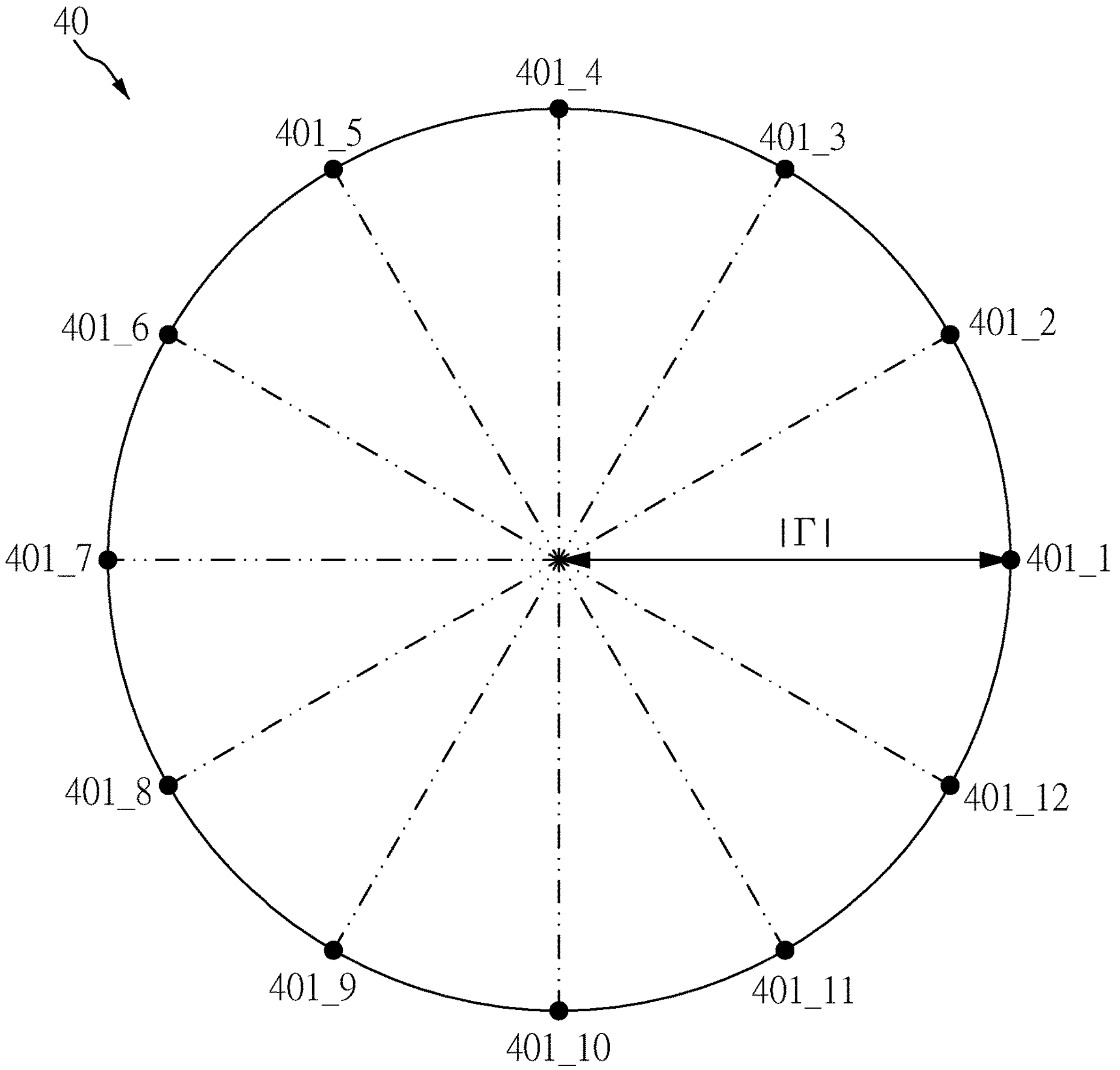
FIG. 4 is a schematic diagram of a reflection coefficient circle according to one embodiment of the present disclosure.

Reference is made to FIG. 4, which is a schematic diagram of a reflection coefficient circle according to one embodiment of the present disclosure. As shown in FIG. 4, a radius of a reflection coefficient circle 40 is the absolute value of the reflection coefficient defined according to the verification requirements, and each of the impedance points on the reflection coefficient circle 40 corresponds to a polar coordinate (i.e., (Γ, θ)), where θ is an angle of the impedance point on the reflection coefficient circle 40 relative to a positive x-axis (e.g., from a center of the reflection coefficient circle 40 to the impedance point 401_1) along a counterclockwise direction, and θ is also referred to as an angular coordinate.

For the convenience of the following description, the present embodiment only takes 12 impedance points 401_1 to 401_12 on the reflection coefficient circle 40 at intervals of 30 degrees as an example, but the present disclosure is not limited thereto. Therefore, in the present embodiment, 12 impedance transformers 201_1 to 201_12 (i.e., N=12) can be provided to correspond to the impedance points 401_1 to 401_12 on the reflection coefficient circle 40, a polar coordinate of the impedance point 401_1 is (Γ, 0°), and so forth, and a polar coordinate of the impedance point 401_12 is (Γ, 330°).

In addition, in the present embodiment, the impedance transformers 201_1 to 201_12 can be further set according to a quarter-wavelength impedance transformation formula, and the second characteristic impedance Z1 of the transmission line 303 can be configured according to formula 1 and formula 2 provided below.

$$Z_1 = Z_1(+\Gamma) = Z_0 \times \sqrt{\frac{-1-|\Gamma|}{|\Gamma|-1}},\ 180° > \theta \geq 0°; \quad \text{[formula 1]}$$

$$Z_1 = Z_1(-\Gamma) = Z_0 \times \sqrt{\frac{1-|\Gamma|}{1+|\Gamma|}},\ 360° > \theta \geq 180°; \quad \text{[formula 2]}$$

In other words, for the impedance transformer corresponding to each of the impedance points whose θ in the polar coordinate is greater than or equal to 0 degrees and less than 180 degrees, the second characteristic impedance Z1 of the transmission line 303 is configured as $Z_1(+\Gamma)$, and for the impedance transformer corresponding to each of the impedance points whose θ in the polar coordinate is greater than or equal to 180 degrees and less than 360 degrees, the second characteristic impedance Z1 of the transmission line 303 is configured as $Z_1(-\Gamma)$. Therefore, in the case that the first characteristic impedance Z0 is 50 ohms and the absolute value of the reflection coefficient is 0.5, the second characteristic impedance Z1 of the transmission line 303 can be configured to be 86.74 or 28.82 ohms in the present embodiment.

In addition, an operating frequency f (e.g., f=2.45 GHZ) can be further defined, by the RF power measurement system 10, according to the verification requirement of the RF power reliability test, and the first trace length $L_1$ of the transmission line 303 can be configured according to the following formula 3:

$$L_1 = \frac{3\times10^8}{\sqrt{\in}\times4\times f}; \quad \text{[formula 3]}$$

∈ is an equivalent dielectric constant, such as 3.18, but the present disclosure is not limited thereto. Therefore, in the case that the operating frequency f is defined as 2.45 GHZ, the first trace length $L_1$ of the transmission line 303 can be configured as 17.512 mm in the present embodiment. In addition, the impedance points 401_1 to 401_12 on the reflection coefficient circle 40 can further correspond to a plurality of indices, respectively. Moreover, for the impedance points 401_1 to 401_6 whose θ in the polar coordinates are greater than or equal to 0 degrees and less than 180 degrees, the corresponding indices are set in increments starting from 0 according to a counterclockwise order of the impedance points 401_1 to 401_6 on the reflection coefficient circle 40, and for the impedance points 401_7 to 401_12 whose θ in the polar coordinates are greater than or equal to 180 degrees and less than 360 degrees, the corresponding indices are also set in increments starting from 0 according to a counterclockwise order of the impedance points 401_7 to 401_12 on the reflection coefficient circle 40. Therefore, the indices corresponding to the impedance points 401_1 and 401_7 are both 0, the indices corresponding to the impedance points 401_2 and 401_8 are both 1, and so forth; the indices corresponding to the impedance points 401_6 and 401_12 are both 5.

In this embodiment, the second trace length $L_2$ can be regarded as being used to adjust phases of the impedance points on the reflection coefficient circle 40, and the second trace length $L_2$ of the feeding line 301 of the k-th impedance transformer 201_*k* can be configured according to the following formula 4:

$$L_2 = \frac{3\times10^8}{\sqrt{\in}\times2\times f\times n}\times Ind_k; \quad \text{[formula 4]}$$

where $Ind_k$ is the index of the impedance point 401_*k* corresponding to the k-th impedance transformer 201_*k*, and n can be obtained by dividing 360 degrees by an angular separation between the impedance points, that is, n equals to a total quantity of the impedance points on the reflection coefficient circle 40. Therefore, in the case where the operating frequency f is defined as 2.45 GHZ, in this embodiment, the second trace lengths L2 of the feeding lines 301 of the impedance transformers 201_1 and 201_7 can be configured to be 0 mm, and the second trace lengths L2 of the feeding lines 301 of the impedance transformers 201_2 and 201_8 are 2.86 mm, and so forth, the second trace lengths L2 of the feeding lines 301 of the impedance transformers 201_6 and 201_12 are 14.3 mm.

In other words, in this embodiment, according to Table 1, the second characteristic impedances Z1, the first trace lengths $L_1$ and the second trace lengths $L_2$ of the impedance transformers 201_1 to 201_12 can be configured to correspond to the impedance points 401_1 to 401_12 on the reflection coefficient circle 40, respectively. Next, in the RF power reliability test, the impedance transformers 201_1 to 201_12 can be coupled between the device under test 103 and the attenuator 104 in turn, such that the RF power measurement system 10 can find the two of the impedance points 401_1 to 401_12 respectively corresponding to the maximum output power and the minimum output power.

TABLE 1

| impedance point | impedance transformer | Z1 (ohms) | $L_1$ (mm) | $L_2$ (mm) |
|---|---|---|---|---|
| 401_1 | 201_1 | 86.74 | 17.512 | 0 |
| 401_2 | 201_2 | 86.74 | 17.512 | 2.86 |
| 401_3 | 201_3 | 86.74 | 17.512 | 5.72 |
| 401_4 | 201_4 | 86.74 | 17.512 | 8.58 |
| 401_5 | 201_5 | 86.74 | 17.512 | 11.44 |
| 401_6 | 201_6 | 86.74 | 17.512 | 14.3 |
| 401_7 | 201_7 | 28.82 | 17.512 | 0 |
| 401_8 | 201_8 | 28.82 | 17.512 | 2.86 |
| 401_9 | 201_9 | 28.82 | 17.512 | 5.72 |
| 401_10 | 201_10 | 28.82 | 17.512 | 8.58 |
| 401_11 | 201_11 | 28.82 | 17.512 | 11.44 |
| 401_12 | 201_12 | 28.82 | 17.512 | 14.3 |

Figure 5:
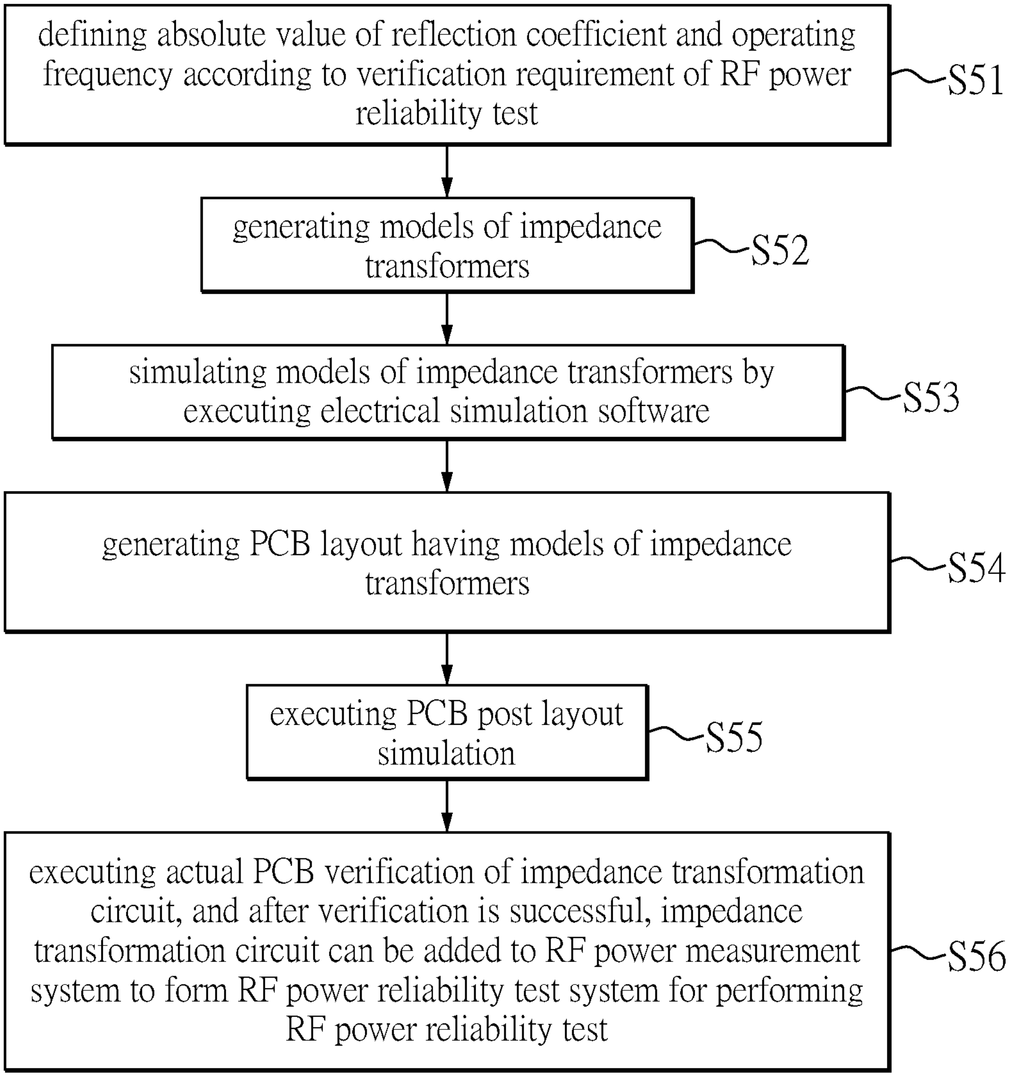
FIG. 5 is a flowchart of a setting process of the impedance transformation circuit according to one embodiment of the present disclosure.

In addition, the present disclosure further provides an implementation of setting the impedance transformation circuit 20, but the present disclosure is not limited thereto. Reference is made to FIG. 5, which is a flowchart of a setting process of the impedance transformation circuit according to one embodiment of the present disclosure. As shown in FIG. 5, the setting process of the impedance transformation circuit 20 includes the following steps:

Step S51: defining an absolute value of a reflection coefficient and an operating frequency f according to a verification requirement of the RF power reliability test.

Step S52: generating models of the impedance transformers 201_1 to 201_N, including configuring the second characteristic impedance Z1, the first trace length $L_1$ and the second trace length $L_2$ of the impedance transformers 201_1 to 201_N according to the above formulas 1 to 4.

Step S53: simulating the models of the impedance transformers 201_1 to 201_N by executing electrical simulation software. If simulation results cannot match required parameters, the setting process can return to step S52. Next, the setting process proceeds to step S54.

Step S54: generating a printed circuit board (PCB) layout having the models of the impedance transformers 201_1 to 201_N.

Step S55: executing PCB post layout simulation. If simulation results cannot match required parameters, the setting process can return to step S54. Next, the setting process proceeds to step S56.

Step S56: executing an actual PCB verification of the impedance transformation circuit 20, and after the verification is successful, the impedance transformation circuit 20 can be added to the RF power measurement system 10 to form the RF power reliability test system 1 of FIG. 2 for performing the RF power reliability test.

In this embodiment, a general-purpose computer system including a processor and a memory can be further configured in the RF power measurement system 10 to execute the above-mentioned setting process of the impedance transformation circuit 20. For example, the processor can execute a plurality of computer-readable instructions stored in the memory to execute the electrical simulation software, generate PCB layout and execute post-PCB layout simulation in the above steps. The general-purpose computer system can also be electrically connected to one or more of the signal generators 101, the buffer 102, the device under test 103, the attenuator 104, and the spectrum analyzer 105, so as to control measurement parameters and receive measurement results.

Figure 6:
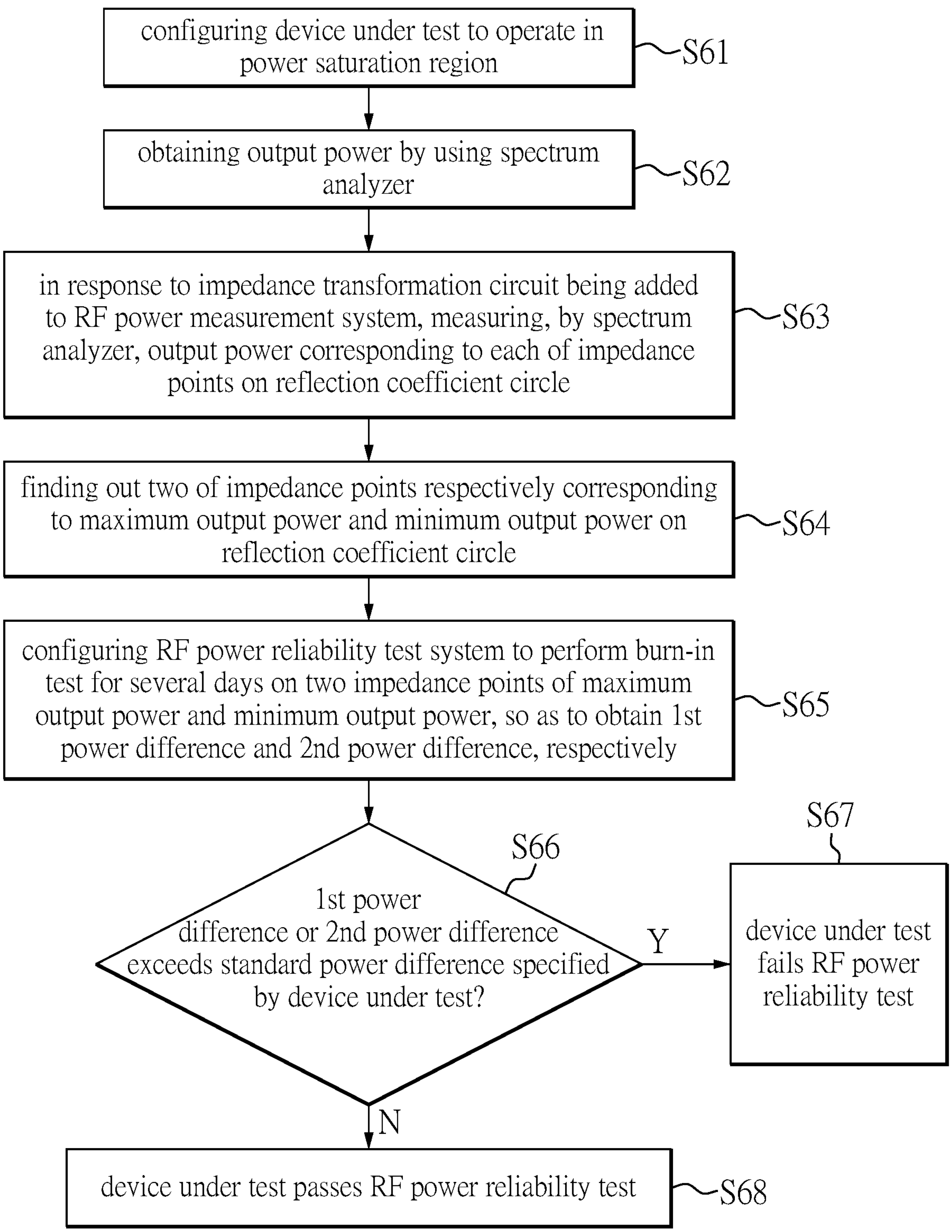
FIG. 6 is a flowchart of a radio frequency power reliability test process according to one embodiment of the present disclosure.

On the other hand, the RF power reliability test system 1 can perform the RF power reliability test by executing an RF power reliability test process. Reference is made to FIG. 6, which is a flowchart of an RF power reliability test process according to one embodiment of the present disclosure, and the RF power reliability test process is applicable to the RF power measurement system 10 of the foregoing embodiment, but the present disclosure is not limited thereto. As shown in FIG. 6, the RF power reliability test process includes the following steps:

Step S63: in response to the impedance transformation circuit 20 being added to the RF power measurement system 10, measuring, by the spectrum analyzer 105, the output power corresponding to each of the impedance points on the reflection coefficient circle 40.

Step S64: finding out the two of the impedance points 401_1 to 401_12 respectively corresponding to the maximum output power and the minimum output power on the reflection coefficient circle 40 (that is, the two impedance points with the maximum and minimum output power among the impedance points 401_1 to 401_12).

Step S65: configuring the RF power reliability test system 1 to perform a burn-in test for several days (e.g., three days) on the two impedance points of the maximum output power and the minimum output power, so as to obtain a first power difference and a second power difference, respectively. For example, one of the impedance transformers 201_1 to 201_N is selected according to the impedance point with the maximum output power and is electrically connected between the device under test 103 and the attenuator 104, and the burn-in test can then be performed.

Similarly, one of the impedance transformers 201_1 to 201_N is selected according to the impedance point with the minimum output power and is electrically connected between the device under test 103 and the attenuator 104, and then the burn-in test can be performed. The first power difference is an output power change of the RF power reliability test system 1 after the burn-in test is performed for several days at a first impedance point with the maximum output power, and the second power difference is an output power change of the RF power reliability test system 1 after the burn-in test is performed for several days at a second impedance point with the minimum output power.

Step S66: determining whether or not the first power difference or the second power difference exceeds a standard power difference specified by the device under test 103. If so, the RF power reliability test proceeds to step S67 to determine that the device under test 103 fails the RF power reliability test; if not, the RF power reliability test proceeds to step S68 to determine that the device under test 103 passes the RF power reliability test.

It should be noted that, before step S63, the RF power reliability test process of the present embodiment can further include the following steps S61 and S62: step S61: configuring the device under test 103 to operate in a power saturation region; and step S62: obtaining, by using the spectrum analyzer 105, the output power.

In conclusion, in the impedance transformation circuit and the RF power reliability test system provided by the present disclosure, a plurality of impedance transformers can be used to replace the load tuner in the RF power reliability test, so as to reduce the cost of RF power reliability test. In addition, since the impedance transformation circuit provided by the present disclosure can be multiplicatively replicated with relative ease, the RF power reliability test of the multiple devices under test can be performed simultaneously, thereby improving the test efficiency.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An impedance transformation circuit for a radio frequency power measurement system, the radio frequency power measurement system including a signal generator, a buffer, a device under test, an attenuator and a spectrum analyzer, and the impedance conversion circuit comprising:

a plurality of impedance transformers corresponding to a plurality of impedance points on a reflection coefficient circle of the Smith chart, respectively, wherein, in a radio frequency power reliability test, the impedance transformers are alternatively coupled between the device under test and the attenuator, and the spectrum analyzer is configured to measure an output power corresponding to each of the plurality of impedance points, such that two of the impedance points corresponding to a maximum output power and a minimum output power are found by the radio frequency power measurement system, wherein each of the impedance transformers is a quarter-wavelength impedance transformer and includes:

a feeding line having a first characteristic impedance;

a resistor having a load resistance; and a transmission line coupled between the feeding line and the resistor, wherein the transmission line has a second characteristic impedance, wherein the transmission line further has a first trace length, and the feeding line further has a second trace length, wherein an absolute value of a reflection coefficient is defined, by the radio frequency power measurement system, according to a verification requirement of the radio frequency power reliability test, and the reflection coefficient circle is determined according to an absolute value of the reflectance.

2. The impedance transformation circuit according to claim 1, wherein the reflection coefficient circle with a radius that equals to the absolute value of the reflectance is determined on the Smith chart.

3. The impedance transformation circuit according to claim 2, wherein each of the impedance points on the reflection coefficient circle corresponds to a polar coordinate, for the impedance transformer corresponding to each of the impedance points whose angular coordinate of the polar coordinate is greater than or equal to 0 degrees and less than 180 degrees, the second characteristic impedance of the transmission line is configured as $Z_1(+\Gamma)$, and for the impedance transformer corresponding to each of the impedance points whose angular coordinate of the polar coordinate is greater than or equal to 180 degrees and less than 360 degrees, the second characteristic impedance of the transmission line is configured as $Z_1(-\Gamma)$.

4. The impedance transformation circuit according to claim 3, wherein $Z_1(+\Gamma)$ and $Z_1(-\Gamma)$ are configured according to the following formula 1 and formula 2:

$$Z_1(+\Gamma) = Z_0 \times \sqrt{\frac{-1-|\Gamma|}{|\Gamma|-1}}; \qquad \text{[formula 1]}$$

$$Z_1(-\Gamma) = Z_0 \times \sqrt{\frac{1-|\Gamma|}{1+|\Gamma|}}; \qquad \text{[formula 2]}$$

where $|\Gamma|$ is the absolute value of the reflection coefficient.

5. The impedance transformation circuit according to claim 4, wherein an operating frequency is further defined, by the radio frequency power measurement system, according to the verification requirement of the radio frequency power reliability test, and the first trace length of the transmission line is configured according to the following formula 3;

$$L_1 = \frac{3\times 10^8}{\sqrt{\in}\times 4\times f}; \qquad \text{[formula 3]}$$

where $L_1$ is the first trace length, $\in$ is an equivalent dielectric constant, and f is the operating frequency.

6. The impedance transformation circuit according to claim 5, wherein the impedance points also correspond to a plurality of indices, and for the impedance points whose angular coordinates in the polar coordinates greater than or equal to 0 degrees and less than 180 degrees, the corresponding indices are set in increments starting from 0 according to a counterclockwise order of the impedance points on the reflection coefficient circle, and for the impedance points whose angular coordinates in the polar coordinates greater than or equal to 180 degrees and less than 360 degrees, the corresponding indices are also set in increments starting from 0 according to a counterclockwise order of the impedance points on the reflection coefficient circle.

7. The impedance transformation circuit according to claim 6, wherein the second trace length of the feeding line of a k-th one of the impedance transformers is configured according to the following formula 4:

$$L_2 = \frac{3\times 10^8}{\sqrt{\in}\times 2\times f\times n}\times Ind\_k; \qquad \text{[formula 4]}$$

where $L_2$ is the second trace length, Ind_k is the index of the impedance point corresponding to the k-th one of the impedance transformers, and n is 360 degrees divided by an angle by which the impedance points are separated from each other.

8. The impedance transformation circuit according to claim 1, further comprising:

a plurality of first subminiature version A (SMA) connectors corresponding to the plurality of impedance transformers, respectively; and a plurality of second SMA connectors corresponding to the plurality of impedance transformers, respectively;

wherein each of the impedance transformers is coupled between the device under test and the attenuator through the corresponding first SMA connector and the corresponding second SMA connector.

9. A radio frequency power reliability test system, comprising:

a radio frequency power measurement system, including:
a spectrum analyzer;
a signal generator configured to generate an input signal;
a buffer coupled to the signal generator;
a device under test coupled to the buffer, wherein the device under test is configured to output a radio frequency signal in response to receiving the input signal; and
an attenuator coupled to the spectrum analyzer, wherein the attenuator is configured to attenuate the radio frequency signal input to the spectrum analyzer; and
a impedance transformation circuit including a plurality of impedance transformers corresponding to a plurality of impedance points on a reflection coefficient circle of a Smith chart, respectively, wherein, in a radio frequency power reliability test, the impedance transformers are alternatively coupled between the device under test and the attenuator, and the spectrum analyzer is configured to measure an output power corresponding to each of the plurality of impedance points, such that two of the impedance points corresponding to a maximum output power and a minimum output power are found by the radio frequency power measurement system,
wherein each of the impedance transformers is a quarter-wavelength impedance transformer, and includes:
a feeding line having a first characteristic impedance;
a resistor having a load resistance; and
a transmission line coupled between the feeding line and the resistor, wherein the transmission line has a second characteristic impedance,
wherein the transmission line further has a first trace length, and the feeding line further has a second trace length,
wherein an absolute value of a reflection coefficient is defined, by the radio frequency power measurement system, according to a verification requirement of the radio frequency power reliability test, and the reflection coefficient circle is determined according to an absolute value of the reflectance.

10. The radio frequency power reliability test system according to claim 9, wherein the reflection coefficient circle with a radius that equals to the absolute value of the reflectance is determined on the Smith chart.

11. The radio frequency power reliability test system according to claim 10, wherein each of the impedance points on the reflection coefficient circle corresponds to a polar coordinate, for the impedance transformer corresponding to each of the impedance points whose angular coordinate of the polar coordinate is greater than or equal to 0 degrees and less than 180 degrees, the second characteristic impedance of the transmission line is configured as $Z_1(+\Gamma)$, and for the impedance transformer corresponding to each of the impedance points whose angular coordinate of the polar coordinate is greater than or equal to 180 degrees and less than 360 degrees, the second characteristic impedance of the transmission line is configured as $Z_1(-\Gamma)$.

12. The radio frequency power reliability test system according to claim 11, wherein $Z_1(+\Gamma)$ and $Z_1(-\Gamma)$ are configured according to the following formula 1 and formula 2:

$$Z_1(+\Gamma) = Z_0 \times \sqrt{\frac{-1-|\Gamma|}{|\Gamma|-1}}; \quad \text{[formula 1]}$$

$$Z_1(-\Gamma) = Z_0 \times \sqrt{\frac{1-|\Gamma|}{1+|\Gamma|}}; \quad \text{[formula 2]}$$

where $|\Gamma|$ is the absolute value of the reflection coefficient.

13. The radio frequency power reliability test system according to claim 12, wherein an operating frequency is further defined, by the radio frequency power measurement system, according to the verification requirement of the radio frequency power reliability test, and the first trace length of the transmission line is configured according to the following formula 3;

$$L_1 = \frac{3\times10^8}{\sqrt{\epsilon}\times4\times f}; \quad \text{[formula 3]}$$

where $L_1$ is the first trace length, $\epsilon$ is an equivalent dielectric constant, and f is the operating frequency.

14. The radio frequency power reliability test system according to claim 13, wherein the impedance points also correspond to a plurality of indices, and for the impedance points whose angular coordinates in the polar coordinates are greater than or equal to 0 degrees and less than 180 degrees, the corresponding indices are set in increments starting from 0 according to a counterclockwise order of the impedance points on the reflection coefficient circle, and for the impedance points whose angular coordinates in the polar coordinates are greater than or equal to 180 degrees and less than 360 degrees, the corresponding indices are also set in increments starting from 0 according to a counterclockwise order of the impedance points on the reflection coefficient circle.

15. The radio frequency power reliability test system according to claim 14, wherein the second trace length of the feeding line of a k-th one of the impedance transformers is configured according to the following formula 4:

$$L_2 = \frac{3\times10^8}{\sqrt{\epsilon}\times2\times f\times n}\times Ind\_k; \quad \text{[formula 4]}$$

where $L_2$ is the second trace length, Ind_k is the index of the impedance point corresponding to the k-th one of the impedance transformers, and n is 360 degrees divided by an angle by which the impedance points are separated from each other.

16. The radio frequency power reliability test system according to claim 9, wherein the impedance transformation circuit further includes:

a plurality of first subminiature version A (SMA) connectors corresponding to the plurality of impedance transformers, respectively; and
a plurality of second SMA connectors corresponding to the plurality of impedance transformers, respectively;
wherein each of the impedance transformers is coupled between the device under test and the attenuator through the corresponding first SMA connector and the corresponding second SMA connector.

* * * * *